(12) United States Patent
Endo et al.

(10) Patent No.: US 7,132,224 B2
(45) Date of Patent: Nov. 7, 2006

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 418 days.

(21) Appl. No.: 10/661,542

(22) Filed: Sep. 15, 2003

(65) Prior Publication Data
US 2004/0253548 A1 Dec. 16, 2004

(30) Foreign Application Priority Data
Jun. 12, 2003 (JP) ............... 2003-168239

(51) Int. Cl.
*G03F 7/20* (2006.01)
(52) U.S. Cl. ....................... 430/322; 430/311
(58) Field of Classification Search ................ 430/311, 430/322
See application file for complete search history.

(56) References Cited

U.S. PATENT DOCUMENTS 6,962,766 B1 * 11/2005 Uenishi et al. .......... 430/270.1

FOREIGN PATENT DOCUMENTS

JP   P2001-316863   11/2001

OTHER PUBLICATIONS

M. Switkes et al., "Immersion lithography at 157 nm", J. Vac. Sci. Technolo., B19, 2353 (2001).

* cited by examiner

*Primary Examiner*—Kathleen Duda
(74) *Attorney, Agent, or Firm*—McDermott Will & Emery LLP

(57) ABSTRACT

After forming a resist film of a chemically amplified resist material including a base polymer, an acid generator for generating an acid through irradiation with light and lactone, pattern exposure is performed by selectively irradiating the resist film with exposing light while supplying, onto the resist film, water that is circulated and temporarily stored in a solution storage. After the pattern exposure, the resist film is subjected to post-exposure bake, and is then developed with an alkaline developer. Thus, a resist pattern made of an unexposed portion of the resist film can be formed in a good shape.

9 Claims, 9 Drawing Sheets

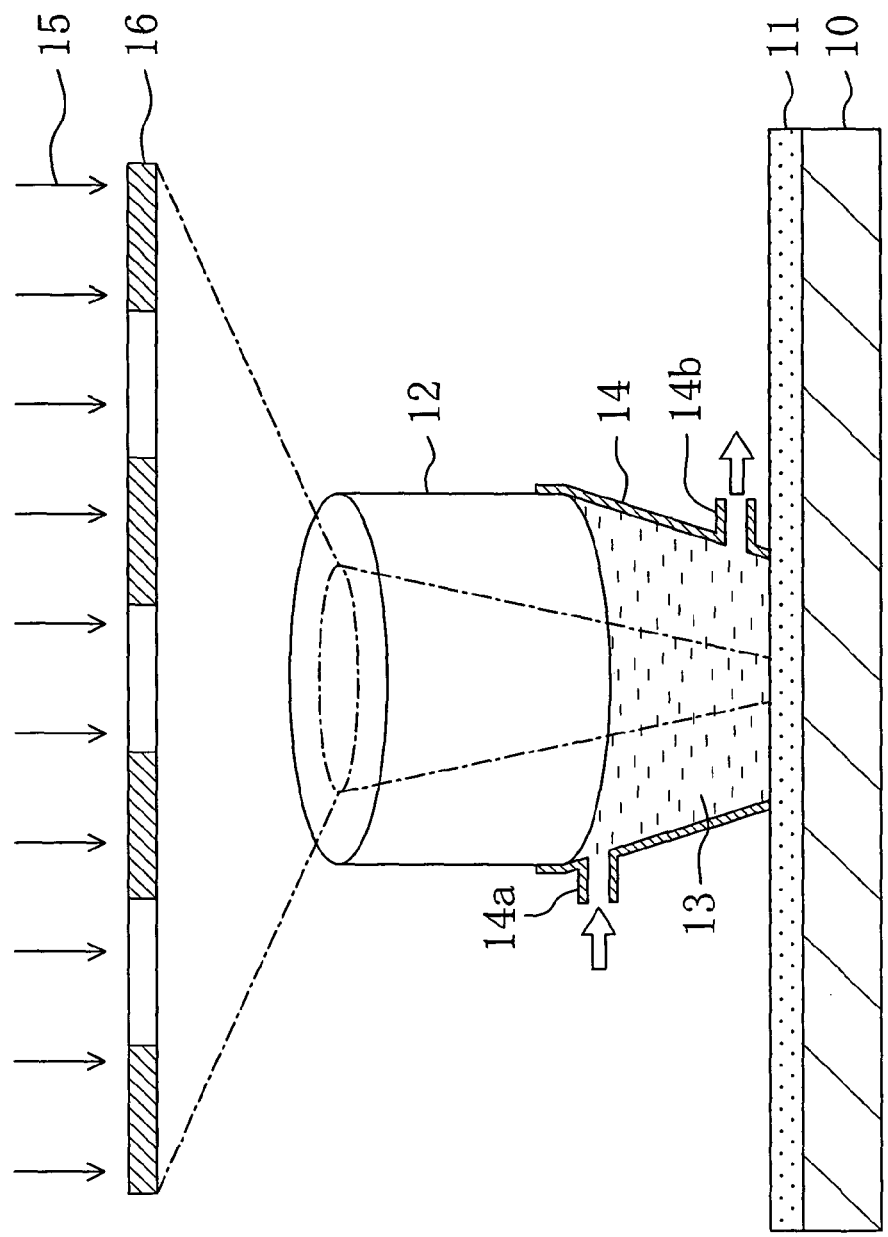

PATTERN FORMATION METHOD

BACKGROUND OF THE INVENTION

The present invention relates to a pattern formation method for use in fabrication process and the like for semiconductor devices.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (M. Switkes and M. Rothschild, "Immersion lithography at 157 nm", J. Vac. Sci. Technol., B19, 2353 (2001)).

In the immersion lithography, a region in an exposure system sandwiched between a projection lens and a resist film formed on a wafer is filled with a solution having a refractive index n, and therefore, the NA (numerical aperture) of the exposure system has a value n·NA. As a result, the resolution of the resist film can be improved.

Now, a first conventional pattern formation method using the immersion lithography will be described with reference to FIGS. 8A through 8D.

First, a positive chemically amplified resist material having the following composition is prepared:

| | |
|---|---|
| Base polymer: poly((norbornene-5-methylene-t-butylcarboxylate) - (maleic anhydride)) (wherein norbornene-5-methylene-t-butylcarboxylate:maleic anhydride = 50 mol %:50 mol %) | 2 g |
| Acid generator: triphenylsulfonium nonaflate | 0.05 g |
| Solvent: propylene glycol monomethyl ether acetate | 20 g |

Next, as shown in FIG. 8A, the aforementioned chemically amplified resist material is applied on a substrate 1 so as to form a resist film 2 with a thickness of 0.35 μm.

Then, as shown in FIG. 8B, while supplying water 3A onto the resist film 2, pattern exposure is carried out by irradiating the resist film 2 with exposing light 4 of ArF excimer laser with NA of 0.65 through a mask 5. Although a projection lens for condensing the exposing light 4 having passed through the mask 5 on the surface of the resist film 2 is not shown in FIG. 8B, a region sandwiched between the projection lens and the resist film 2 is filled with the water 3A. Thus, an exposed portion 2a of the resist film 2 becomes soluble in an alkaline developer because an acid is generated from the acid generator therein while an unexposed portion 2b of the resist film 2 remains insoluble in an alkaline developer because no acid is generated from the acid generator therein.

After the pattern exposure, as shown in FIG. 8C, the resist film 2 is baked with a hot plate at a temperature of 110° C. for 60 seconds, and the resultant resist film is developed with a 2.38 wt % tetramethylammonium hydroxide developer (alkaline developer). In this manner, a resist pattern 6A made of the unexposed portion 2b of the resist film 2 can be obtained as shown in FIG. 8D.

Next, a second conventional pattern formation method using the immersion lithography will be described with reference to FIGS. 9A through 9D.

First, a positive chemically amplified resist material having the following composition is prepared:

| | |
|---|---|
| Base polymer: poly((norbornene-5-methylene-t-butylcarboxylate) - (maleic anhydride)) (wherein norbornene-5-methylene-t-butylcarboxylate:maleic anhydride = 50 mol %:50 mol %) | 2 g |
| Acid generator: triphenylsulfonium nonaflate | 0.05 g |
| Solvent: propylene glycol monomethyl ether acetate | 20 g |

Next, as shown in FIG. 9A, the aforementioned chemically amplified resist material is applied on a substrate 1 so as to form a resist film 2 with a thickness of 0.20 μm.

Then, as shown in FIG. 9B, while supplying perfluoropolyether 3B onto the resist film 2, pattern exposure is carried out by irradiating the resist film 2 with exposing light 4 of $F_2$ laser with NA of 0.60 through a mask 5. Although a projection lens for condensing the exposing light 4 having passed through the mask 5 on the surface of the resist film 2 is not shown in FIG. 9B, a region sandwiched between the projection lens and the resist film 2 is filled with the perfluoropolyether 3B. Thus, an exposed portion 2a of the resist film 2 becomes soluble in an alkaline developer because an acid is generated from the acid generator therein while an unexposed portion 2b of the resist film 2 remains insoluble in an alkaline developer because no acid is generated from the acid generator therein.

After the pattern exposure, as shown in FIG. 9C, the resist film 2 is baked with a hot plate at a temperature of 100° C. for 60 seconds, and the resultant resist film is developed with a 2.38 wt % tetramethylammonium hydroxide developer (alkaline developer). In this manner, a resist pattern 6B made of the unexposed portion 2b of the resist film 2 can be obtained as shown in FIG. 9D.

As shown in FIGS. 8D and 9D, however, each of the resist patterns 6A and 6B formed by the first and second conventional pattern formation methods is in a defective T-top shape.

Since the positive chemically amplified resist material is used in each of the first and second conventional pattern formation methods, the resist pattern 6A or 6B is in the T-top shape. When a negative chemically amplified resist material is used instead, the resultant resist pattern is in a defective shape with round shoulders.

When a resist pattern in such a defective shape is used for etching a target film, the resultant pattern is also in a defective shape, which disadvantageously lowers the productivity and the yield in the fabrication process for semiconductor devices.

SUMMARY OF THE INVENTION

In consideration of the aforementioned conventional problem, an object of the invention is forming a resist pattern in a good shape by the immersion lithography.

In order to achieve the object, the first pattern formation method of this invention includes the steps of forming a resist film of a chemically amplified resist material including a base polymer, an acid generator for generating an acid through irradiation with light and lactone; performing pattern exposure by selectively irradiating the resist film with exposing light while supplying a solution onto the resist film; and forming a resist pattern by developing the resist film after the pattern exposure.

The second pattern formation method of this invention includes the steps of forming a resist film of a chemically amplified resist material including a base polymer, an acid generator for generating an acid through irradiation with light and a polymer containing lactone; performing pattern exposure by selectively irradiating the resist film with exposing light while supplying a solution onto the resist film; and forming a resist pattern by developing the resist film after the pattern exposure.

In the first or second pattern formation method, a carbonyl group included in the lactone exhibits polarity, and therefore, the acid generated from the acid generator is held by the carbonyl group in the resist film. Accordingly, the acid can be prevented from being deactivated in an exposed portion of the resist film, so that the resist pattern can be formed in a good shape. As a result, since a target film can be etched by using the resist pattern in a good shape, the resultant pattern can be in a good shape. Thus, the productivity and the yield in the fabrication process for semiconductor devices can be improved.

In the first or second pattern formation method, the lactone means a cyclic compound having a —CO—O— group in a ring of hydroxycarboxylic acid as represented by Chemical Formula 1, and specific examples of the lactone are mevalonic lactone, γ-butyrolactone, γ-valerolactone and δ-valerolactone.

Chemical Formula 1:

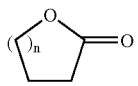

wherein n is an integer of 1 through 4.

In the second pattern formation method, the polymer for containing the lactone may be poly(acrylic ester) or poly (methacrylic ester).

The third pattern formation method of this invention includes the steps of forming a resist film of a chemically amplified resist material including a base polymer, an acid generator for generating an acid through irradiation with light and carbohydrate lactone; performing pattern exposure by selectively irradiating the resist film with exposing light while supplying a solution onto the resist film; and forming a resist pattern by developing the resist film after the pattern exposure.

In the third pattern formation method, a carbonyl group included in the lactone exhibits polarity, and therefore, the acid generated from the acid generator is held by the carbonyl group in the resist film. Accordingly, the acid can be prevented from being deactivated in an exposed portion of the resist film, so that the resist pattern can be formed in a good shape. As a result, since a target film can be etched by using the resist pattern in a good shape, the resultant pattern can be in a good shape. Thus, the productivity and the yield in the fabrication process for semiconductor devices can be improved.

In the third pattern formation method, the carbohydrate lactone may be D-gluconic acid δ-lactone, β-D-glucofurannurone acid γ-lactone or L-mannal acid di-γ-lactone.

The fourth pattern formation method of this invention includes the steps of forming a resist film of a chemically amplified resist material including a base polymer, an acid generator for generating an acid through irradiation with light and sultone; performing pattern exposure by selectively irradiating the resist film with exposing light while supplying a solution onto the resist film; and forming a resist pattern by developing the resist film after the pattern exposure.

In the fourth pattern formation method, a sulfonyl group included in the sultone exhibits polarity, and therefore, the acid generated from the acid generator is held by the sulfonyl group in the resist film. Accordingly, the acid can be prevented from being deactivated in an exposed portion of the resist film, so that the resist pattern can be formed in a good shape. As a result, since a target film can be etched by using the resist pattern in a good shape, the resultant pattern can be in a good shape. Thus, the productivity and the yield in the fabrication process for semiconductor devices can be improved.

In the fourth pattern formation method, the sultone means a cyclic compound having a —SO$_2$—O— group in a ring of hydroxysulfonic acid as represented by Chemical Formula 2, and specific examples of the sultone are pentane-2,5-sultone and naphthalene-1,8-sultone.

Chemical Formula 2:

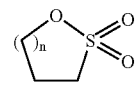

wherein n is an integer of 1 through 4.

The fifth pattern formation method of this invention includes the steps of forming a resist film of a chemically amplified resist material including a base polymer, an acid generator for generating an acid through irradiation with light and sultine; performing pattern exposure by selectively irradiating the resist film with exposing light while supplying a solution onto the resist film; and forming a resist pattern by developing the resist film after the pattern exposure.

In the fifth pattern formation method, a sulfonyl group included in the sultine exhibits polarity, and therefore, the acid generated from the acid generator is held by the sulfonyl group in the resist film. Accordingly, the acid can be prevented from being deactivated in an exposed portion of the resist film, so that the resist pattern can be formed in a good shape. As a result, since a target film can be etched by using the resist pattern in a good shape, the resultant pattern can be in a good shape. Thus, the productivity and the yield in the fabrication process for semiconductor devices can be improved.

In the fifth pattern formation method, the sultine means a cyclic compound having a —SO—O— group in a ring of hydroxysulfonic acid as represented by Chemical Formula 3, and a specific example of the sultine is 3H-2,1-benzoxathiol=1-oxide.

Chemical Formula 3:

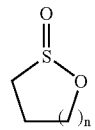

wherein n is an integer of 1 through 4.

In each of the first through fifth pattern formation methods, the solution is preferably water.

When water with a large refractive index is used as the solution, a value n·NA can be definitely increased.

In each of the first through fifth pattern formation methods, the solution is preferably perfluoropolyether.

In the case where perfluoropolyether is used as the solution, even if a water-soluble film is formed on the resist pattern, the water-soluble film can be prevented from being dissolved in the solution.

BRIEF DESCRIPTION OF THE DRAWINGS

FIG. 1 is a partial cross-sectional view of an exposure system commonly used in preferred embodiments of the invention;

DETAILED DESCRIPTION OF THE INVENTION

Figure 2A:
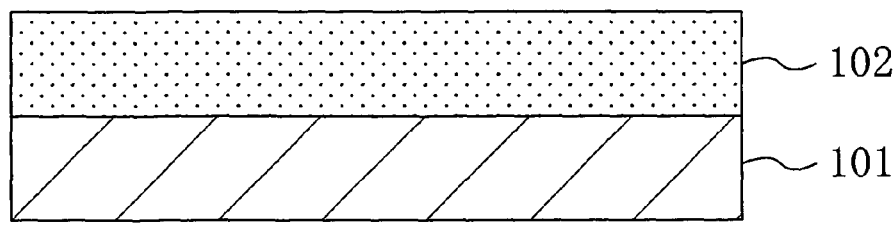
FIGS. 2A, 2B, 2C and 2D are cross-sectional views for showing procedures in a pattern formation method according to Embodiment 1 of the invention.

Pattern formation methods according to preferred embodiments of the invention will now be described, and first of all, an exposure system used in each embodiment will be described with reference to FIG. 1. It is noted that the exposure system used in the pattern formation method of each embodiment is not limited to one having the structure shown in FIG. 1 but any of systems capable of realizing the immersion lithography can be used.

As shown in FIG. 1, a projection lens 12 of the exposure system is provided above a resist film 11 formed on a semiconductor substrate 10, and a solution storage 14 for storing a solution 13 (with a refractive index n) is provided between the projection lens 12 and the resist film 11. The solution storage 14 is provided with an inlet 14a for allowing the solution 13 to flow into and an outlet 14b for allowing the solution 13 to flow out of the solution storage 14, and the solution 13 having flown into the solution storage 14 through the inlet 14a is temporarily stored in the solution storage 14 and then flows out through the outlet 14b. Accordingly, exposing light 15 passes through a mask 16 having a desired pattern, and is then condensed by the projection lens 12 so as to reach the surface of the resist film 11 through the solution 13. Therefore, the numerical aperture NA of the exposing light that reaches the surface of the resist film 11 through the solution 13 has a value n times as large as that attained when the exposing light reaches without passing through the solution 13.

Embodiment 1

A pattern formation method according to Embodiment 1 of the invention will now be described with reference to FIGS. 2A through 2D.

First, a positive chemically amplified resist material having the following composition is prepared:

| | |
|---|---|
| Base polymer: poly((norbornene-5-methylene-t-butylcarboxylate) - (maleic anhydride)) (wherein norbornene-5-methylene-t-butylcarboxylate:maleic anhydride = 50 mol %:50 mol %) | 2 g |
| Lactone: γ-butyrolactone | 0.06 g |
| Acid generator: triphenylsulfonium nonaflate | 0.05 g |
| Solvent: propylene glycol monomethyl ether acetate | 20 g |

Next, as shown in FIG. 2A, the aforementioned chemically amplified resist material is applied on a substrate 101 so as to form a resist film 102 with a thickness of 0.35 μm.

Figure 2B:
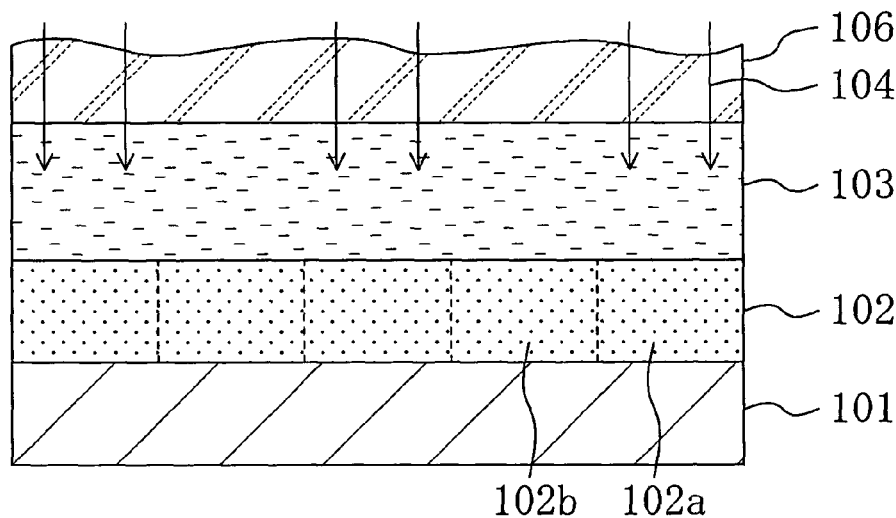

Then, as shown in FIG. 2B, while supplying, onto the resist film 102, water 103 (having a refractive index n of 1.44) that is circulated and temporarily stored in the solution storage 14 (shown in FIG. 1), pattern exposure is carried out by irradiating the resist film 102 with exposing light 104 of ArF excimer laser with NA of 0.65 through a mask not shown. In FIG. 2B, a reference numeral 106 denotes a projection lens disposed above the resist film 102. Thus, an exposed portion 102a of the resist film 102 becomes soluble in an alkaline developer because an acid is generated from the acid generator therein while an unexposed portion 102b of the resist film 102 remains insoluble in an alkaline developer because no acid is generated from the acid generator therein.

Figure 2C:
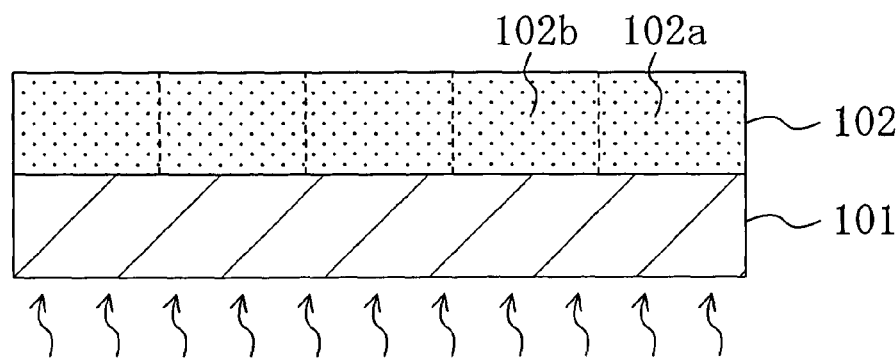
Figure 2D:
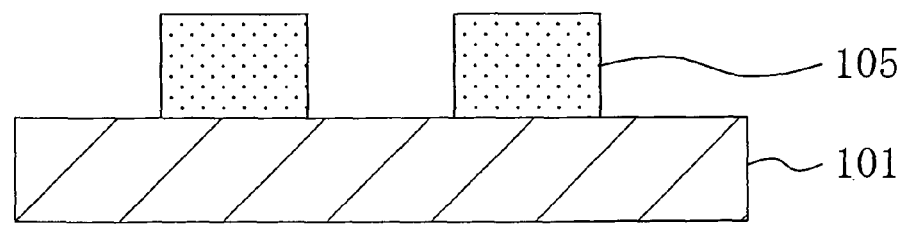

After the pattern exposure, as shown in FIG. 2C, the resist film 102 is baked with a hot plate at a temperature of 110° C. for 60 seconds, and the resultant resist film is developed with a 2.38 wt % tetramethylammonium hydroxide developer (alkaline developer). In this manner, a resist pattern 105 made of the unexposed portion 102b of the resist film 102 and having a line width of 0.09 μm can be formed in a good shape as shown in FIG. 2D.

In Embodiment 1, since a carbonyl group included in the lactone exhibits polarity, the acid generated from the acid generator is held by the carbonyl group in the resist film 102. Accordingly, the acid can be prevented from being deactivated in the exposed portion 102a of the resist film 102, so that the resist pattern 105 can be formed in a good shape.

Embodiment 2

A pattern formation method according to Embodiment 2 of the invention will now be described with reference to FIGS. 3A through 3D.

First, a negative chemically amplified resist material having the following composition is prepared:

| | |
|---|---|
| Base polymer: poly((norbornene-5-methylenecarboxylic acid) - (maleic anhydride)) (wherein norbornene-5-methylenecarboxylic acid:maleic anhydride = 50 mol %:50 mol %) | 2 g |
| Crosslinking agent: 1,3,5-N-(trihydroxymethyl)melamine | 0.4 g |
| Lactone: δ-valerolactone | 0.07 g |
| Acid generator: triphenylsulfonium nonaflate | 0.05 g |
| Solvent: propylene glycol monomethyl ether acetate | 20 g |

Figure 3A:
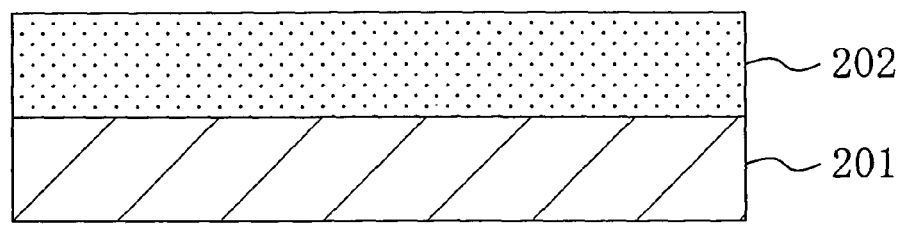
FIGS. 3A, 3B, 3C and 3D are cross-sectional views for showing procedures in a pattern formation method according to Embodiment 2 of the invention.

Next, as shown in FIG. 3A, the aforementioned chemically amplified resist material is applied on a substrate 201 so as to form a resist film 202 with a thickness of 0.35 μm.

Figure 3B:
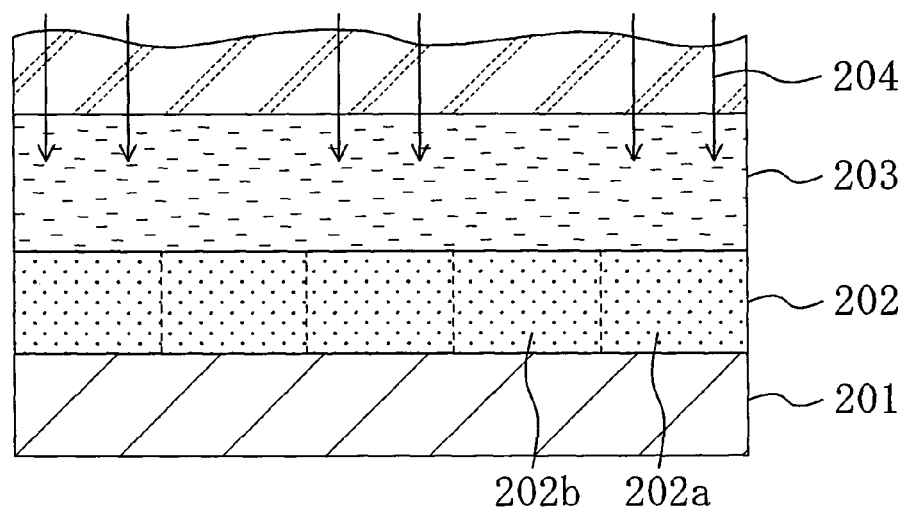

Then, as shown in FIG. 3B, while supplying, onto the resist film 202, water 203 that is circulated and temporarily stored in the solution storage 14 (shown in FIG. 1), pattern exposure is carried out by irradiating the resist film 202 with exposing light 204 of ArF excimer laser with NA of 0.65 through a mask not shown. Thus, an exposed portion 202a of the resist film 202 becomes insoluble in an alkaline developer due to the function of the crosslinking agent because an acid is generated from the acid generator therein while an unexposed portion 202b of the resist film 202 remains soluble in an alkaline developer because no acid is generated from the acid generator therein.

Figure 3C:
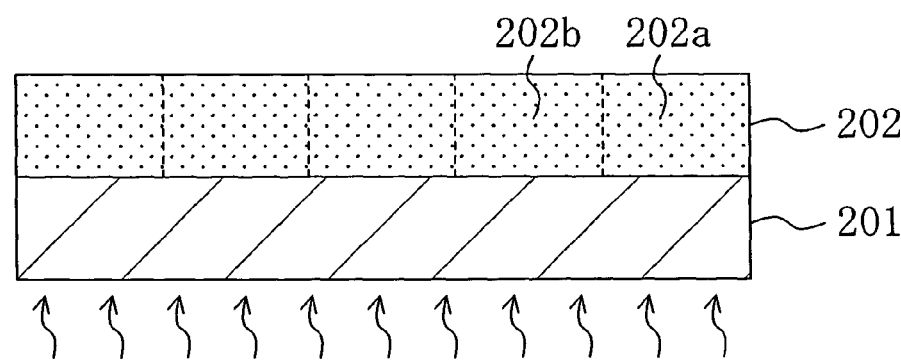
Figure 3D:
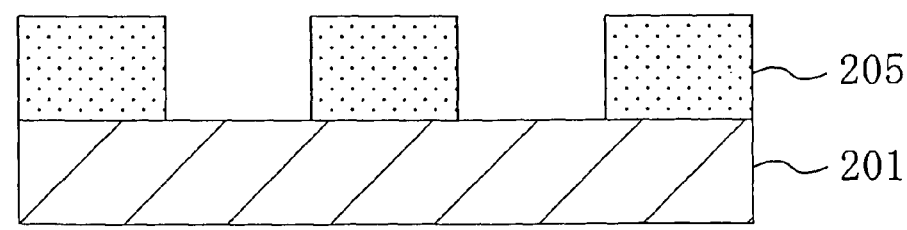

After the pattern exposure, as shown in FIG. 3C, the resist film 202 is baked with a hot plate at a temperature of 120° C. for 60 seconds, and the resultant resist film is developed with a 2.38 wt % tetramethylammonium hydroxide developer (alkaline developer). In this manner, a resist pattern 205 made of the exposed portion 202a of the resist film 202 and having a line width of 0.09 μm can be formed in a good shape as shown in FIG. 3D.

In Embodiment 2, since a carbonyl group included in the lactone exhibits polarity, the acid generated from the acid generator is held by the carbonyl group in the resist film 202. Accordingly, the acid can be prevented from being deactivated in the exposed portion 202a of the resist film 202, so that the resist pattern 205 can be formed in a good shape.

In Embodiment 1 or 2, the lactone can be, for example, mevalonic lactone, γ-butyrolactone, γ-valerolactone or δ-valerolactone.

Also, the mixing ratio of the lactone in the chemically amplified resist material is several wt % and may be appropriately changed.

Embodiment 3

A pattern formation method according to Embodiment 3 of the invention will now be described with reference to FIGS. 4A through 4D.

First, a positive chemically amplified resist material having the following composition is prepared:

| | |
|---|---|
| Base polymer: poly((norbornene-5-methylene-t-butylcarboxylate) - (maleic anhydride)) (wherein norbornene-5-methylene-t-butylcarboxylate:maleic anhydride = 50 mol %:50 mol %) | 2 g |
| Polymer including lactone: poly(mevalonic lactone methacrylate) | 0.04 g |
| Acid generator: triphenylsulfonium nonaflate | 0.05 g |
| Solvent: propylene glycol monomethyl ether acetate | 20 g |

Figure 4A:
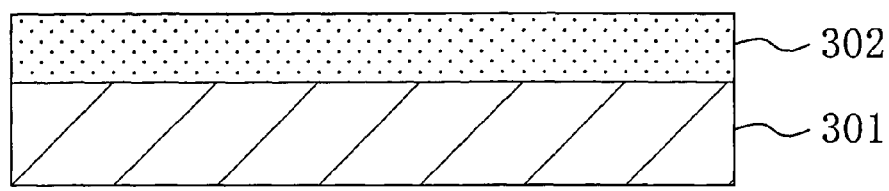
FIGS. 4A, 4B, 4C and 4D are cross-sectional views for showing procedures in a pattern formation method according to Embodiment 3 of the invention.

Next, as shown in FIG. 4A, the aforementioned chemically amplified resist material is applied on a substrate 301 so as to form a resist film 302 with a thickness of 0.20 μm.

Figure 4B:
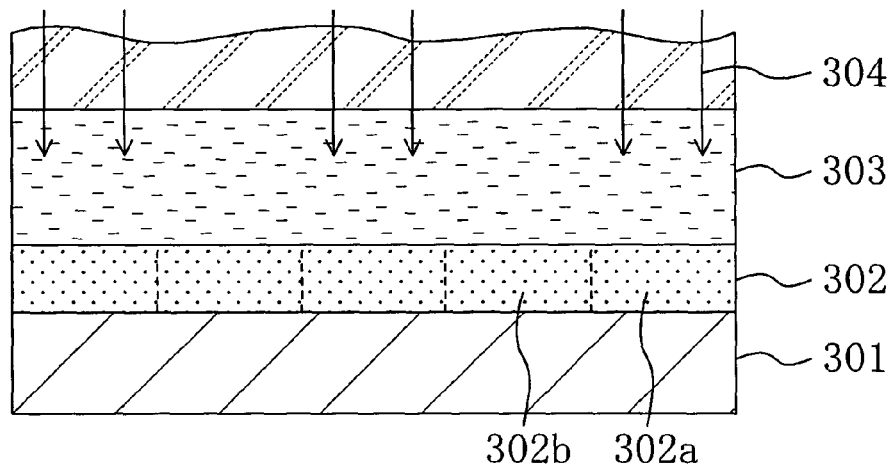

Then, as shown in FIG. 4B, while supplying, onto the resist film 302, a nonaqueous solution 303 of perfluoropolyether (having a refractive index n of 1.37) that is represented by Chemical Formula 4 and is circulated and temporarily stored in the solution storage 14 (shown in FIG. 1), pattern exposure is carried out by irradiating the resist film 302 with exposing light 304 of F$_2$ laser with NA of 0.60 through a mask not shown. Thus, an exposed portion 302a of the resist film 302 becomes soluble in an alkaline developer because an acid is generated from the acid generator therein while an unexposed portion 302b of the resist film 302 remains insoluble in an alkaline developer because no acid is generated from the acid generator therein.

Chemical Formula 4:

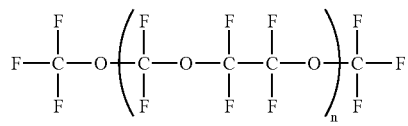

Figure 4C:
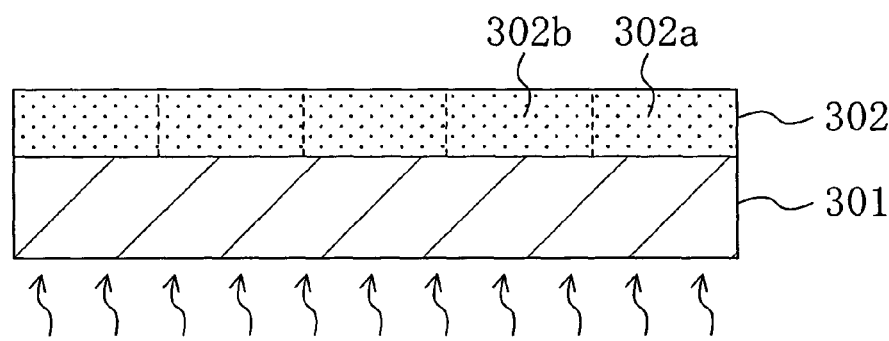
Figure 4D:
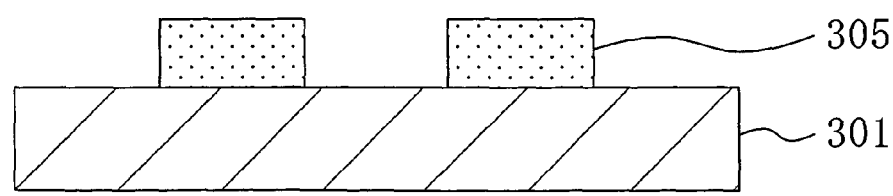

After the pattern exposure, as shown in FIG. 4C, the resist film 302 is baked with a hot plate at a temperature of 100° C. for 60 seconds, and the resultant resist film is developed with a 2.38 wt % tetramethylammonium hydroxide developer (alkaline developer). In this manner, a resist pattern 305 made of the unexposed portion 302b of the resist film 302 and having a line width of 0.06 μm can be formed in a good shape as shown in FIG. 4D.

In Embodiment 3, since a carbonyl group included in the lactone exhibits polarity, the acid generated from the acid generator is held by the carbonyl group in the resist film 302. Accordingly, the acid can be prevented from being deactivated in the exposed portion 302a of the resist film 302, so that the resist pattern 305 can be formed in a good shape.

Embodiment 4

A pattern formation method according to Embodiment 4 of the invention will now be described. Embodiment 4 is different from Embodiment 3 merely in using a negative chemically amplified resist material, and therefore, the chemically amplified resist material alone will be herein described.

| | |
|---|---|
| Base polymer: poly((norbornene-5-methylenecarboxylic acid) - (maleic anhydride)) (wherein norbornene-5-methylenecarboxylic acid:maleic anhydride = 50 mol %:50 mol %) | 2 g |
| Crosslinking agent: 1,3,5-N-(trihydroxymethyl)melamine | 0.7 g |
| Polymer including lactone: poly(γ-valerolactone methacrylate) | 0.05 g |
| Acid generator: triphenylsulfonium nonaflate | 0.05 g |
| Solvent: propylene glycol monomethyl ether acetate | 20 g |

In Embodiment 3 or 4, the lactone can be, for example, mevalonic lactone, γ-butyrolactone, γ-valerolactone or δ-valerolactone, and examples of the polymer for including lactone are poly(acrylic ester) and poly(methacrylic ester).

Also, the mixing ratio of the polymer including lactone in the chemically amplified resist material is several wt % and may be appropriately changed.

Embodiment 5

A pattern formation method according to Embodiment 5 of the invention will now be described with reference to FIGS. 5A through 5D.

First, a positive chemically amplified resist material having the following composition is prepared:

| | |
|---|---|
| Base polymer: poly((norbornene-5-methylene-t-butylcarboxylate) - (maleic anhydride)) (wherein norbornene-5-methylene-t-butylcarboxylate:maleic anhydride = 50 mol %:50 mol %) | 2 g |
| Carbohydrate lactone: D-gluconic acid δ-lactone | 0.07 g |
| Acid generator: triphenylsulfonium nonaflate | 0.05 g |
| Solvent: propylene glycol monomethyl ether acetate | 20 g |

Figure 5A:
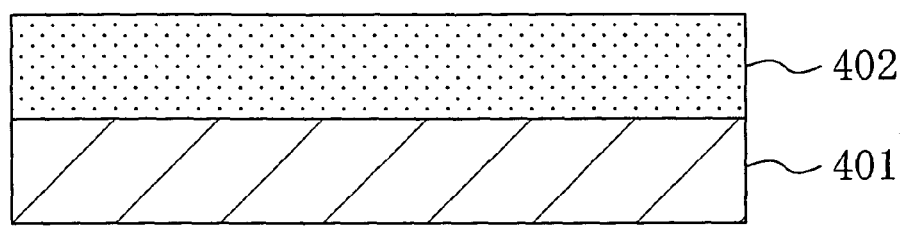
FIGS. 5A, 5B, 5C and 5D are cross-sectional views for showing procedures in a pattern formation method according to Embodiment 5 of the invention.

Next, as shown in FIG. 5A, the aforementioned chemically amplified resist material is applied on a substrate 401 so as to form a resist film 402 with a thickness of 0.35 μm.

Figure 5B:
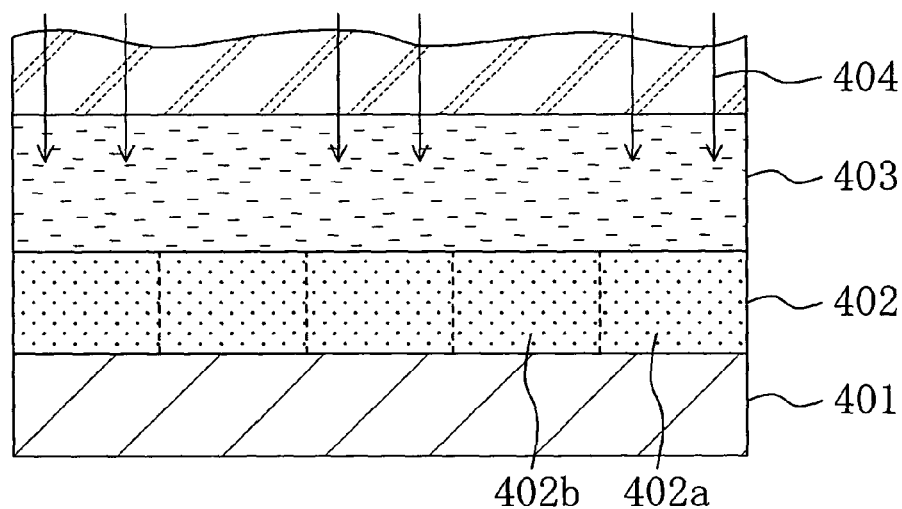

Then, as shown in FIG. 5B, while supplying, onto the resist film 402, water 403 (with a refractive index n of 1.44) that is circulated and temporarily stored in the solution storage 14 (shown in FIG. 1), pattern exposure is carried out by irradiating the resist film 402 with exposing light 404 of ArF excimer laser with NA of 0.65 through a mask not shown. Thus, an exposed portion 402a of the resist film 402 becomes insoluble in an alkaline developer because an acid is generated from the acid generator therein while an unexposed portion 402b of the resist film 402 remains soluble in an alkaline developer because no acid is generated from the acid generator therein.

Figure 5C:
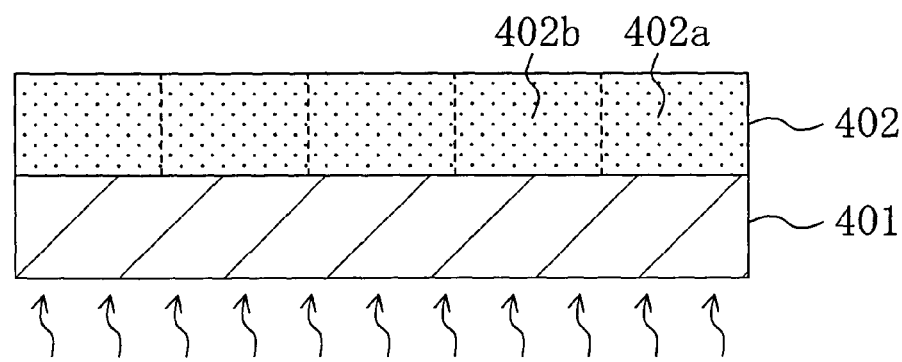
Figure 5D:
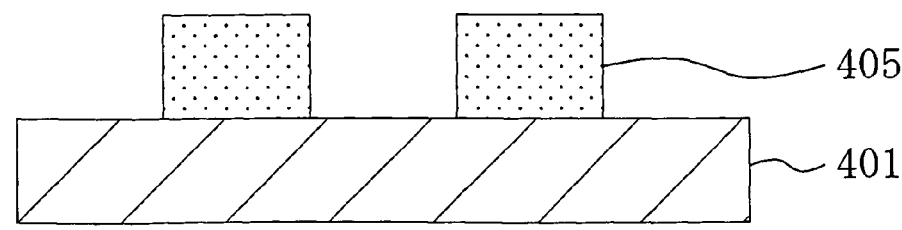

After the pattern exposure, as shown in FIG. 5C, the resist film 402 is baked with a hot plate at a temperature of 110° C. for 60 seconds, and the resultant resist film is developed with a 2.38 wt % tetramethylammonium hydroxide developer (alkaline developer). In this manner, a resist pattern 405 made of the unexposed portion 402b of the resist film 402 and having a line width of 0.09 μm can be formed in a good shape as shown in FIG. 5D.

In Embodiment 5, since a carbonyl group included in the lactone exhibits polarity, the acid generated from the acid generator is held by the carbonyl group in the resist film 402. Accordingly, the acid can be prevented from being deactivated in the exposed portion 402a of the resist film 402, so that the resist pattern 405 can be formed in a good shape.

Embodiment 6

A pattern formation method according to Embodiment 6 of the invention will now be described. Embodiment 6 is different from Embodiment 5 merely in using a negative chemically amplified resist material, and therefore, the chemically amplified resist material alone will be herein described.

| | |
|---|---|
| Base polymer: poly((norbornene-5-methylenecarboxylic acid) - (maleic anhydride)) (wherein norbornene-5-methylenecarboxylic acid:maleic anhydride = 50 mol %:50 mol %) | 2 g |
| Crosslinking agent: 1,3,5-N-(trihydroxymethyl)melamine | 0.4 g |
| Carbohydrate lactone: β-D-glucofurannurone acid γ-lactone | 0.06 g |
| Acid generator: triphenylsulfonium nonaflate | 0.05 g |
| Solvent: propylene glycol monomethyl ether acetate | 20 g |

In Embodiment 5 or 6, the carbohydrate lactone can be, for example, D-gluconic acid δ-lactone, β-D-glucofurannurone acid γ-lactone, L-mannal acid di-γ-lactone or the like.

Also, the mixing ratio of the carbohydrate lactone in the chemically amplified resist material is several wt % and may be appropriately changed.

Embodiment 7

A pattern formation method according to Embodiment 7 of the invention will now be described with reference to FIGS. 6A through 6D.

First, a positive chemically amplified resist material having the following composition is prepared:

| | |
|---|---|
| Base polymer: poly((norbornene-5-methylene-t-butylcarboxylate) - (maleic anhydride)) (wherein norbornene-5-methylene-t-butylcarboxylate:maleic anhydride = 50 mol %:50 mol %) | 2 g |
| Sultone: pentane-2,5-sultone | 0.1 g |
| Acid generator: triphenylsulfonium nonaflate | 0.05 g |
| Solvent: propylene glycol monomethyl ether acetate | 20 g |

Figure 6A:
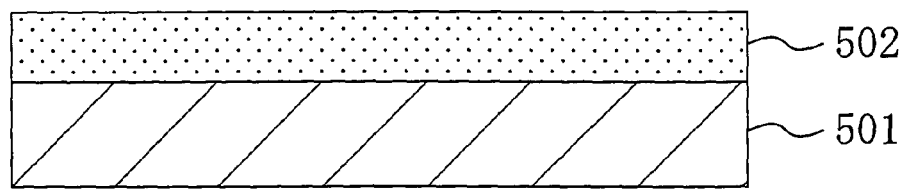
FIGS. 6A, 6B, 6C and 6D are cross-sectional views for showing procedures in a pattern formation method according to Embodiment 7 of the invention.

Next, as shown in FIG. 6A, the aforementioned chemically amplified resist material is applied on a substrate 501 so as to form a resist film 502 with a thickness of 0.20 μm.

Figure 6B:
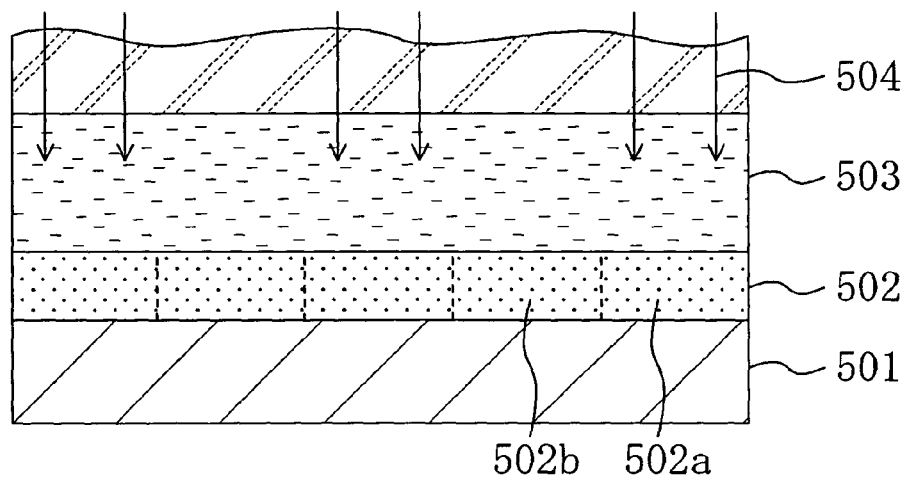

Then, as shown in FIG. 6B, while supplying, onto the resist film 502, a nonaqueous solution 503 of perfluoropolyether (having a refractive index n of 1.37) that is circulated and temporarily stored in the solution storage 14 (shown in FIG. 1), pattern exposure is carried out by irradiating the resist film 502 with exposing light 504 of $F_2$ laser with NA of 0.60 through a mask not shown. Thus, an exposed portion 502a of the resist film 502 becomes soluble in an alkaline developer because an acid is generated from the acid generator therein while an unexposed portion 502b of the resist film 502 remains insoluble in an alkaline developer because no acid is generated from the acid generator therein.

Figure 6C:
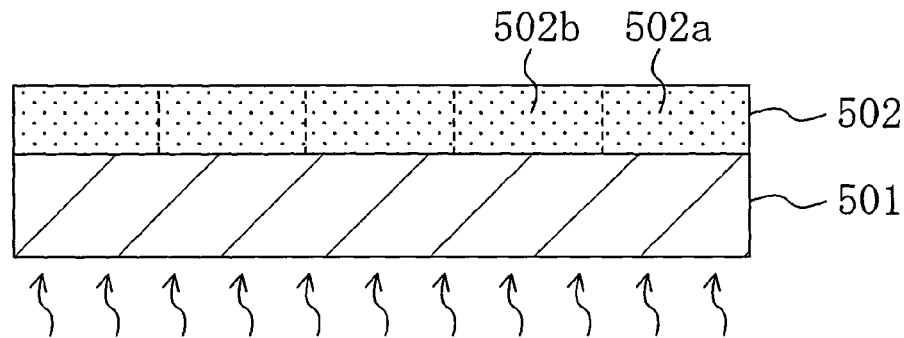
Figure 6D:
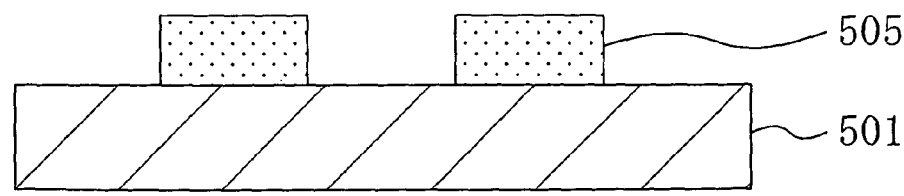

After the pattern exposure, as shown in FIG. 6C, the resist film 502 is baked with a hot plate at a temperature of 100° C. for 60 seconds, and the resultant resist film is developed with a 2.38 wt % tetramethylammonium hydroxide developer (alkaline developer). In this manner, a resist pattern 505 made of the unexposed portion 502b of the resist film 502 and having a line width of 0.06 μm can be formed in a good shape as shown in FIG. 6D.

In Embodiment 7, since a sulfonyl group included in the sultone exhibits polarity, the acid generated from the acid generator is held by the sulfonyl group in the resist film 502. Accordingly, the acid can be prevented from being deactivated in the exposed portion 502a of the resist film 502, so that the resist pattern 505 can be formed in a good shape.

Embodiment 8

A pattern formation method according to Embodiment 8 of the invention will now be described. Embodiment 8 is different from Embodiment 7 merely in using a negative chemically amplified resist material, and therefore, the chemically amplified resist material alone will be herein described.

| | |
|---|---|
| Base polymer: poly((norbornene-5-methylenecarboxylic acid) - (maleic anhydride)) (wherein norbornene-5-methylenecarboxylic acid:maleic anhydride = 50 mol %:50 mol %) | 2 g |

-continued

| | |
|---|---|
| Crosslinking agent: 1,3,5-N-(trihydroxymethyl)melamine | 0.4 g |
| Sultone: naphthalene-1,8-sultone | 0.06 g |
| Acid generator: triphenylsulfonium nonaflate | 0.05 g |
| Solvent: propylene glycol monomethyl ether acetate | 20 g |

In Embodiment 7 or 8, the sultone can be, for example, pentane-2,5-sultone, naphthalene-1,8-sultone or the like.

Also, the mixing ratio of the sultone in the chemically amplified resist material is several wt % and may be appropriately changed.

Embodiment 9

A pattern formation method according to Embodiment 9 of the invention will now be described with reference to FIGS. 7A through 7D.

First, a positive chemically amplified resist material having the following composition is prepared:

| | |
|---|---|
| Base polymer: poly((norbornene-5-methylene-t-butylcarboxylate) - (maleic anhydride)) (wherein norbornene-5-methylene-t-butylcarboxylate:maleic anhydride = 50 mol %:50 mol %) | 2 g |
| Sultine: 3H-2,1-benzoxathiol = 1-oxide | 0.05 g |
| Acid generator: triphenylsulfonium nonaflate | 0.05 g |
| Solvent: propylene glycol monomethyl ether acetate | 20 g |

Figure 7A:
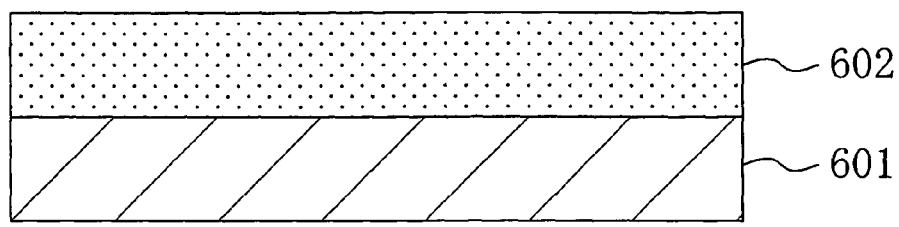
FIGS. 7A, 7B, 7C and 7D are cross-sectional views for showing procedures in a pattern formation method according to Embodiment 9 of the invention.

Next, as shown in FIG. 7A, the aforementioned chemically amplified resist material is applied on a substrate 601 so as to form a resist film 602 with a thickness of 0.35 μm.

Figure 7B:
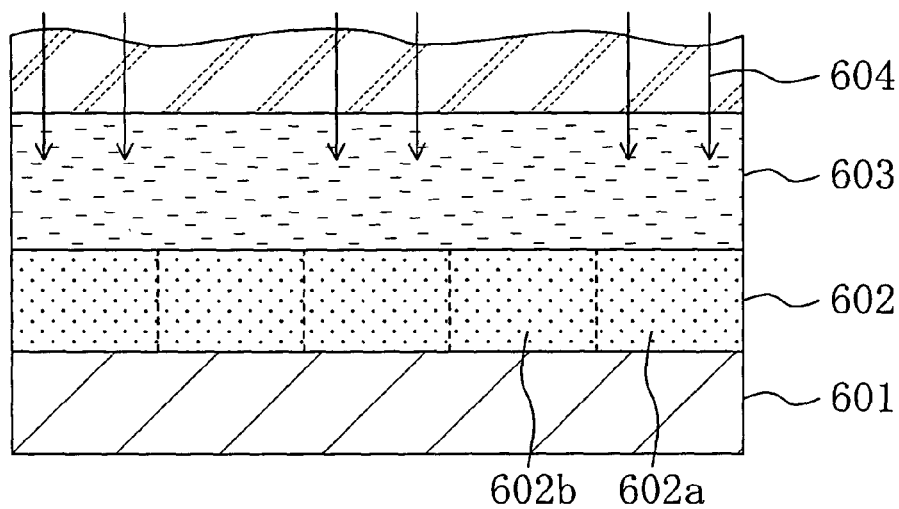

Then, as shown in FIG. 7B, while supplying, onto the resist film 602, water 603 (with a refractive index n of 1.44) that is circulated and temporarily stored in the solution storage 14 (shown in FIG. 1), pattern exposure is carried out by irradiating the resist film 602 with exposing light 604 of ArF excimer laser with NA of 0.65 through a mask not shown. Thus, an exposed portion 602a of the resist film 602 becomes soluble in an alkaline developer because an acid is generated from the acid generator therein while an unexposed portion 602b of the resist film 602 remains insoluble in an alkaline developer because no acid is generated from the acid generator therein.

Figure 7C:
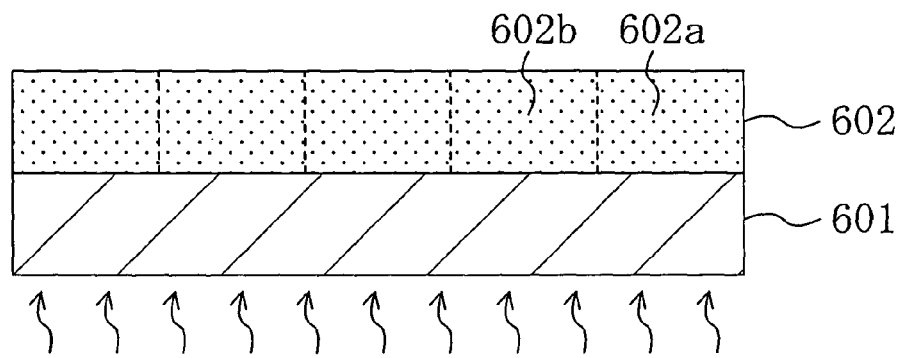
Figure 7D:
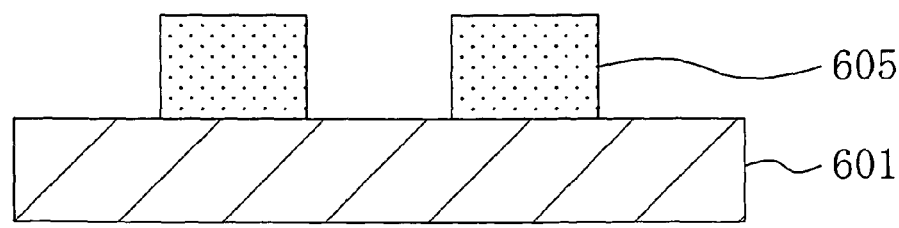
Figure 8A:
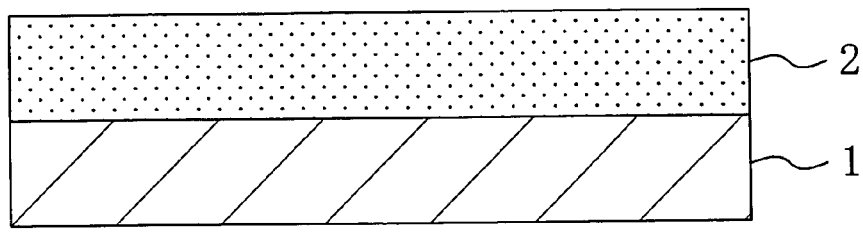
FIGS. 8A, 8B, 8C and 8D are cross-sectional views for showing procedures in a first conventional pattern formation method.
Figure 8B:
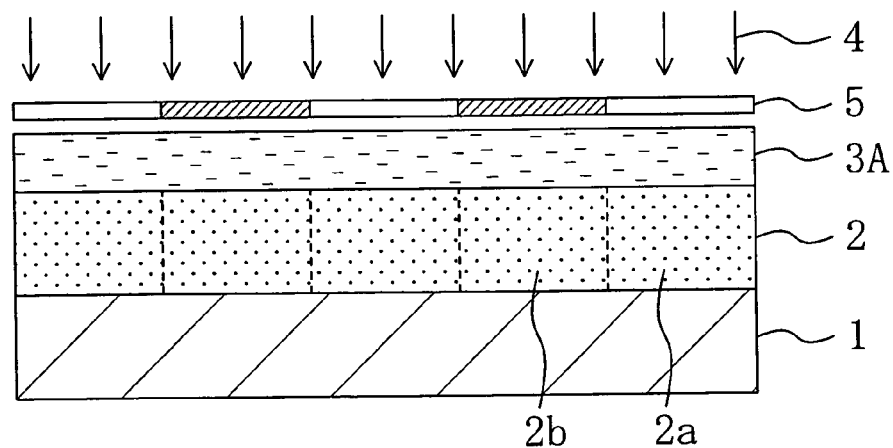
Figure 8C:
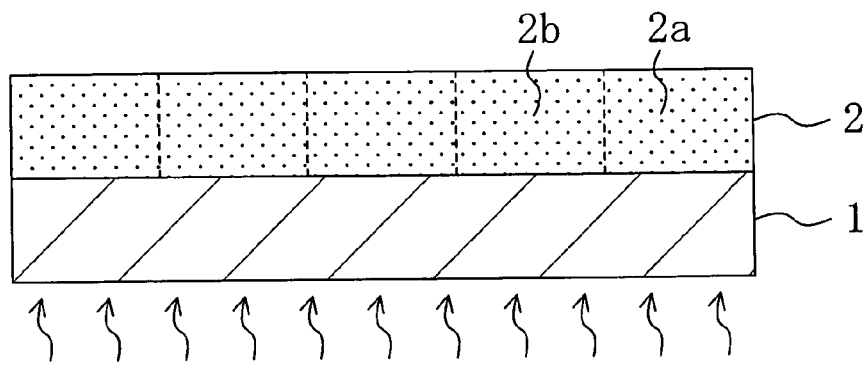
Figure 8D:
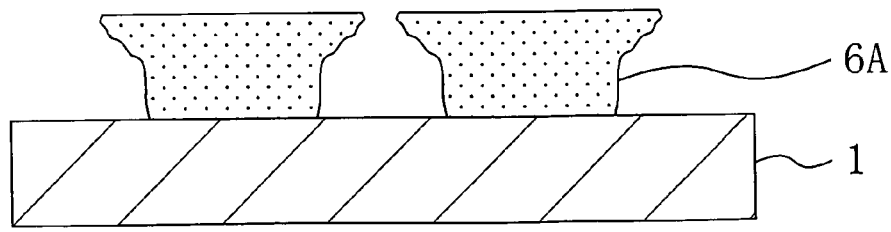
Figure 9A:
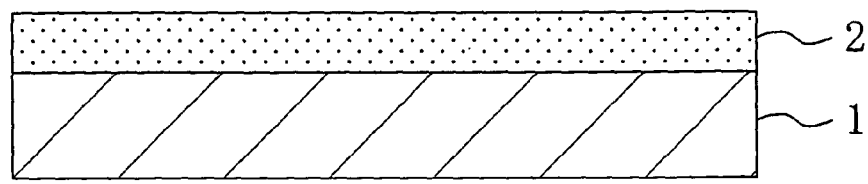
FIGS. 9A, 9B, 9C and 9D are cross-sectional views for showing procedures in a second conventional pattern formation method.
Figure 9B:
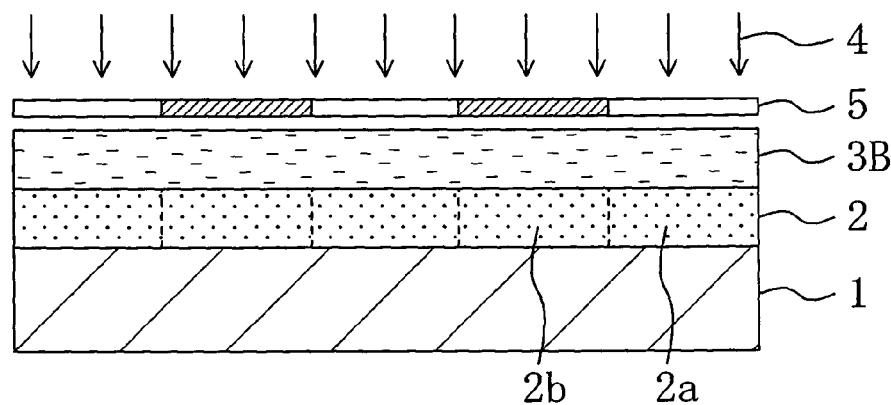
Figure 9C:
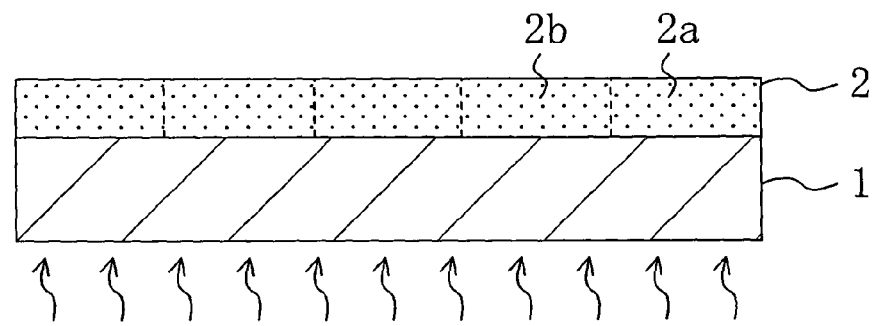
Figure 9D:
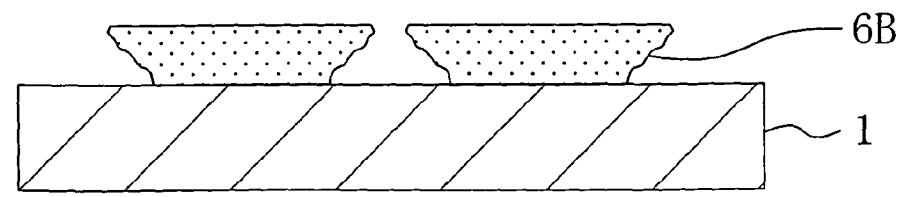

After the pattern exposure, as shown in FIG. 7C, the resist film 602 is baked with a hot plate at a temperature of 110° C. for 60 seconds, and the resultant resist film is developed with a 2.38 wt % tetramethylammonium hydroxide developer (alkaline developer). In this manner, a resist pattern 605 made of the unexposed portion 602b of the resist film 602 and having a line width of 0.09 μm can be formed in a good shape as shown in FIG. 7D.

In Embodiment 9, since a sulfonyl group included in the sultine exhibits polarity, the acid generated from the acid generator is held by the sulfonyl group in the resist film 602. Accordingly, the acid can be prevented from being deactivated in the exposed portion 602a of the resist film 602, so that the resist pattern 605 can be formed in a good shape.

Embodiment 10

A pattern formation method according to Embodiment 10 of the invention will now be described. Embodiment 10 is different from Embodiment 9 merely in using a negative chemically amplified resist material, and therefore, the chemically amplified resist material alone will be herein described.

| | |
|---|---|
| Base polymer: poly((norbornene-5-methylenecarboxylic acid) - (maleic anhydride)) (wherein norbornene-5-methylenecarboxylic acid:maleic anhydride = 50 mol %:50 mol %) | 2 g |
| Crosslinking agent: 1,3,5-N-(trihydroxymethyl)melamine | 0.4 g |
| Sultine: 3H-2,1-benzoxathiol = 1-oxide | 0.07 g |
| Acid generator: triphenylsulfonium nonaflate | 0.05 g |
| Solvent: propylene glycol monomethyl ether acetate | 20 g |

In Embodiment 9 or 10, the sultine is not limited to 3H-2,1-benzoxathiol=1-oxide.

Also, the mixing ratio of the sultine in the chemically amplified resist material is several wt % and may be appropriately changed.

Although the chemically amplified resist material used in each of Embodiments 1 through 10 includes one of lactone, a polymer including lactone, carbohydrate lactone, sultone and sultine, some of them may be included in the chemically amplified resist material.

Furthermore, in each of Embodiments 1 through 10, water or a nonaqueous solution of perfluoropolyether or the like can be appropriately used as the solution supplied onto the resist film. In the case where the exposing light is UV such as a g-line or an i-line, or deep UV such as KrF laser, ArF laser, $Kr_2$ laser, ArKr laser or $Ar_2$ laser, the solution is preferably water, and in the case where the exposing light is vacuum UV such as $F_2$ laser, the solution is preferably a nonaqueous solution.

What is claimed is:

1. A pattern formation method comprising the steps of:
   forming a resist film of a chemically amplified resist material including a base polymer and an acid generator for generating an acid through irradiation with light, the material further including sultone, carbohydrate sultone, sultine, or carbohydrate sultine;
   performing pattern exposure by selectively irradiating said resist film with exposing light while supplying an immersion solution onto said resist film; and
   forming a resist pattern by developing said resist film after the pattern exposure.

2. The pattern formation method of claim 1, wherein said immersion solution is water.

3. The pattern formation method of claim 1, wherein said immersion solution is perfluoropolyether.

4. The pattern formation method of claim 1, wherein said exposing light is KrF excimer laser, ArF excimer laser, or $F_2$ laser.

5. The pattern formation method of claim 1, wherein said lactone is melavonic lactone, y-butyrolactone, y-valerolactone or ÿ-valerolactone.

6. The pattern formation method of claim 1, wherein said polymer containing said lactone, said sultone, or said sultine is poly(acrylic ester) or poly(methacrylic ester).

7. The pattern formation method of claim 1, wherein said carbohydrate lactone is D-gluconic acid δ-lactone, β-D-glucofurannurone acid y-lactone or L-mannal acid di-y-lactone.

8. The pattern formation method of claim 1, wherein said sultone is pentane-2,5-sultone or naphthalene-1,8-sultone.

9. The pattern formation method of claim 1, wherein said sultine is 3H-2,1-benzoxathiol=1-oxide.

* * * * *